(12) United States Patent  (10) Patent No.: US 12,464,794 B2
Asaba et al.  (45) Date of Patent: Nov. 4, 2025

(54) SILICON CARBIDE SEMICONDUCTOR DEVICE WITH IMPROVED AVALANCHE RESISTANCE

(71) Applicants: TOSHIBA ELECTRONIC DEVICES & STORAGE CORPORATION, Tokyo (JP); KABUSHIKI KAISHA TOSHIBA, Tokyo (JP)

(72) Inventors: Shunsuke Asaba, Himeji Hyogo (JP); Hiroshi Kono, Himeji Hyogo (JP)

(73) Assignees: Toshiba Electronic Devices & Storage Corporation, Kawasaki (JP); Kabushiki Kaisha Toshiba, Kawasaki (JP)

( * ) Notice: Subject to any disclaimer, the term of this patent is extended or adjusted under 35 U.S.C. 154(b) by 505 days.

(21) Appl. No.: 17/940,373

(22) Filed: Sep. 8, 2022

(65) Prior Publication Data

US 2023/0307502 A1  Sep. 28, 2023

(30) Foreign Application Priority Data

Mar. 22, 2022 (JP) ................................. 2022-045801

(51) Int. Cl.
*H10D 62/832* (2025.01)
*H10D 12/01* (2025.01)
*H10D 30/66* (2025.01)

(52) U.S. Cl.
CPC ....... *H10D 62/8325* (2025.01); *H10D 12/031* (2025.01); *H10D 30/66* (2025.01)

(58) Field of Classification Search
CPC .. H10D 62/8325; H10D 12/031; H10D 30/66; H10D 44/466; H10D 62/142;

(Continued)

(56) References Cited

U.S. PATENT DOCUMENTS 9,887,285 B1 * 2/2018 Oota ................... H10D 62/107
2006/0267022 A1  11/2006 Mizukami et al.
(Continued)

FOREIGN PATENT DOCUMENTS

JP  2003-158147 A  5/2003
JP  2007-013087 A  1/2007
(Continued)

OTHER PUBLICATIONS

Notice of Reasons for Refusal (Office Action) dated Mar. 4, 2025 in corresponding Japanese Patent Application No. 2022-045801 with English machine translation (11 pages).

*Primary Examiner* — Eliseo Ramos Feliciano
*Assistant Examiner* — Timothy Edward Duren
(74) *Attorney, Agent, or Firm* — Kim & Stewart LLP

(57) ABSTRACT

A semiconductor device includes: a first conductive type first silicon carbide region including a first region, a second region and a third region both on the first region, the second region having impurity concentration equal to or higher than the first region, and the third region having impurity concentration higher than the second region; a second conductive type second silicon carbide region on the first silicon carbide region, the second silicon carbide region including a fourth region in contact with the second region and a fifth region in contact with the third region, and the fifth region having impurity concentration higher than the fourth region; a third silicon carbide region of a first conductive type on the second silicon carbide region; a first gate electrode; a first electrode having a first portion in contact with the second silicon carbide region and the third silicon carbide region; and a second electrode.

10 Claims, 10 Drawing Sheets

(58) Field of Classification Search
CPC ...... H10D 62/364; A01N 1/10; A23B 11/753; A61K 40/422; H10F 39/90
See application file for complete search history.

(56) References Cited

U.S. PATENT DOCUMENTS

| | | |
|---|---|---|
| 2012/0025262 A1 | 2/2012 | Niimura |
| 2013/0234158 A1 | 9/2013 | Kono et al. |
| 2014/0210008 A1 | 7/2014 | Oritsuki et al. |
| 2020/0091295 A1* | 3/2020 | Ohashi ............... H01L 29/1608 |
| 2020/0279940 A1 | 9/2020 | Kono et al. |
| 2021/0359098 A1 | 11/2021 | Shimizu |
| 2022/0149001 A1 | 5/2022 | Sekine et al. |

FOREIGN PATENT DOCUMENTS

| | | | |
|---|---|---|---|
| JP | 2013179221 A | | 9/2013 |
| JP | 2014146738 A | | 8/2014 |
| JP | 2015-056644 A | | 3/2015 |
| JP | 2019165245 A | * | 9/2019 |
| JP | 2021180262 A | | 11/2021 |
| JP | 2022175975 A | * | 11/2022 |
| WO | 2020184338 A1 | | 9/2020 |

* cited by examiner

SILICON CARBIDE SEMICONDUCTOR DEVICE WITH IMPROVED AVALANCHE RESISTANCE

CROSS-REFERENCE TO RELATED APPLICATION

This application is based upon and claims the benefit of priority from Japanese Patent Application No. 2022-045801, filed on Mar. 22, 2022, the entire contents of which are incorporated herein by reference.

FIELD

Embodiments described herein relate generally to a semiconductor device.

BACKGROUND

Silicon carbide is expected as a material for next-generation semiconductor devices. Silicon carbide has physical properties such as a band gap, a breakdown field strength, and a thermal conductivity that are about 3 times, about 10 times, and about 3 times better than those of silicon, respectively. By utilizing these characteristics, for example, a metal oxide semiconductor field effect transistor (MOSFET) capable of operating at a high breakdown voltage, a low loss, and a high temperature can be realized.

In the MOSFET using silicon carbide, it is desired to improve avalanche resistance.

DETAILED DESCRIPTION

Figure 1:
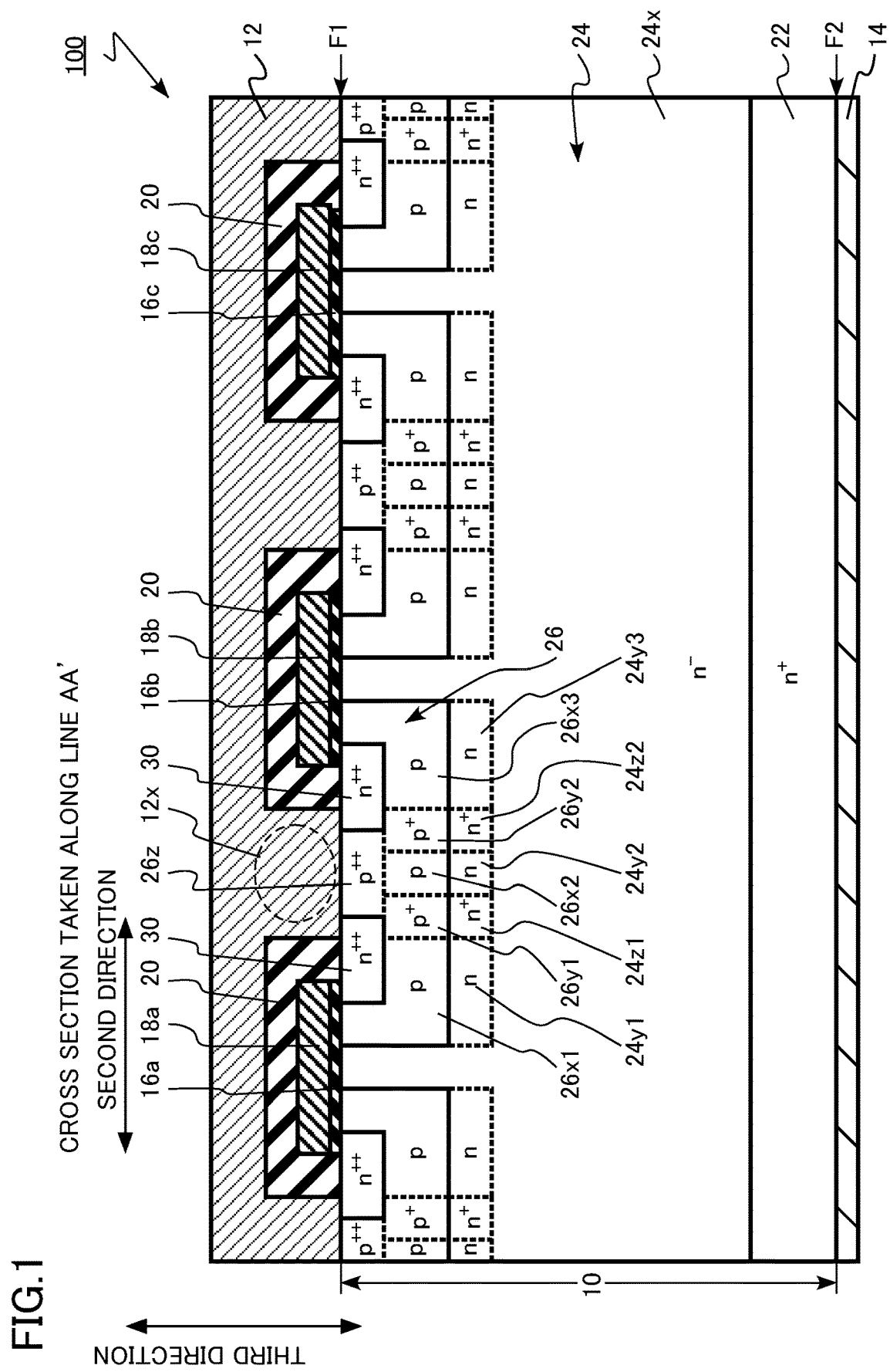
FIG. 1 is a schematic cross-sectional view of a semiconductor device of a first embodiment.

A semiconductor device of an embodiment includes: a silicon carbide layer having a first face and a second face facing the first face; a first silicon carbide region of a first conductive type provided in the silicon carbide layer, the first silicon carbide region including a first region, a second region, and a third region, the second region is disposed between the first region and the first face, the third region is disposed between the first region and the first face, a first-conductivity type impurity concentration in the second region is equal to or higher than a first-conductivity type impurity concentration in the first region, and a first-conductivity type impurity concentration in the third region is higher than the first-conductivity type impurity concentration in the second region; a second silicon carbide region of a second conductive type provided in the silicon carbide layer and disposed between the first silicon carbide region and the first face, the second silicon carbide region including a fourth region and a fifth region, the fourth region is in contact with the second region, the fifth region is in contact with the third region, and a second-conductivity type impurity concentration in the fifth region is higher than a second-conductivity type impurity concentration in the fourth region; a third silicon carbide region of a first conductive type provided in the silicon carbide layer and disposed between the second silicon carbide region and the first face; a first gate electrode provided on a side of the first face of the silicon carbide layer, the first gate electrode extending in a first direction parallel to the first face, and the first gate electrode facing the second silicon carbide region on the first face; a second gate electrode provided on the side of the first face of the silicon carbide layer, the second gate electrode extending in the first direction, the second gate electrode provided in a second direction with respect to the first gate electrode, the second direction being parallel to the first face and perpendicular to the first direction, and the second gate electrode facing the second silicon carbide region on the first face; a first gate insulating layer provided between the second silicon carbide region and the first gate electrode; a second gate insulating layer provided between the second silicon carbide region and the second gate electrode; a first electrode provided on the side of the first face of the silicon carbide layer, the first electrode having a first portion provided between the first gate electrode and the second gate electrode and in contact with the second silicon carbide region and the third silicon carbide region; and a second electrode provided on the side of the second face of the silicon carbide layer.

Hereinafter, embodiments of the present disclosure will be described with reference to the drawings. Note that in the following description, the same or similar members and the like are denoted by the same reference numerals, and the descriptions of the members and the like once described may be appropriately omitted.

In addition, in the following description, when there are notations of $n^{++}$, $n^+$, n, $n^-$, $p^{++}$, $p^+$, p, and $p^-$, these notations indicate relative levels of impurity concentrations in respective conductive types. That is, $n^{++}$ indicates an n-type impurity concentration relatively higher than that of $n^+$, $n^+$ indicates an n-type impurity concentration relatively higher than that of n, and $n^-$ indicates an n-type impurity concentration relatively lower than that of n. In addition, $p^{++}$ indicates a p-type impurity concentration relatively higher than that of $p^+$, $p^+$ indicates a p-type impurity concentration relatively higher than that of p, and $p^-$ indicates a p-type impurity concentration relatively lower than that of p. Note that an $n^+$-type and an $n^-$-type may be simply referred to as an n-type, and a $p^+$-type and a $p^-$-type may be simply referred to as a p-type.

An impurity concentration can be measured by, for example, secondary ion mass spectrometry (SIMS). In addition, a relative level of the impurity concentration can also be determined from a level of a carrier concentration obtained by, for example, scanning capacitance microscopy (SCM). In addition, a distance such as a width or a depth of an impurity region can be obtained by, for example, SIMS. The distance such as the width or the depth of the impurity region, can be obtained from, for example, an SCM image or a scanning electron microscope (SEM) image. In addition, a thickness or the like of an insulating layer can be measured on, for example, an SIMS, SEM, or transmission electron microscope (TEM) image.

Note that in the present specification, a "p-type impurity concentration" in a p-type silicon carbide region means a net p-type impurity concentration obtained by subtracting an n-type impurity concentration in the corresponding region from the p-type impurity concentration in the corresponding region. In addition, an "n-type impurity concentration" in an n-type silicon carbide region means a net n-type impurity concentration obtained by subtracting a p-type impurity concentration in the corresponding region from the n-type impurity concentration in the corresponding region.

In addition, unless otherwise stated in the specification, the impurity concentration in a specific region is represented by the impurity concentration at the central portion of the corresponding region.

First Embodiment

A semiconductor device of a first embodiment includes: a silicon carbide layer having a first face and a second face facing the first face; a first silicon carbide region of a first conductive type provided in the silicon carbide layer, the first silicon carbide region including a first region, a second region, and a third region, the second region is disposed between the first region and the first face, the third region is disposed between the first region and the first face, a first-conductivity type impurity concentration in the second region is equal to or higher than a first-conductivity type impurity concentration in the first region, and a first-conductivity type impurity concentration in the third region is higher than the first-conductivity type impurity concentration in the second region; a second silicon carbide region of a second conductive type provided in the silicon carbide layer and disposed between the first silicon carbide region and the first face, the second silicon carbide region including a fourth region and a fifth region, the fourth region is in contact with the second region, the fifth region is in contact with the third region, and a second-conductivity type impurity concentration in the fifth region is higher than a second-conductivity type impurity concentration in the fourth region; a third silicon carbide region of a first conductive type provided in the silicon carbide layer and disposed between the second silicon carbide region and the first face; a first gate electrode provided on a side of the first face of the silicon carbide layer, the first gate electrode extending in a first direction parallel to the first face, and the first gate electrode facing the second silicon carbide region on the first face; a second gate electrode provided on the side of the first face of the silicon carbide layer, the second gate electrode extending in the first direction, the second gate electrode provided in a second direction with respect to the first gate electrode, the second direction being parallel to the first face and perpendicular to the first direction, and the second gate electrode facing the second silicon carbide region on the first face; a first gate insulating layer provided between the second silicon carbide region and the first gate electrode; a second gate insulating layer provided between the second silicon carbide region and the second gate electrode; a first electrode provided on the side of the first face of the silicon carbide layer, the first electrode having a first portion provided between the first gate electrode and the second gate electrode and in contact with the second silicon carbide region and the third silicon carbide region; and a second electrode provided on the side of the second face of the silicon carbide layer.

The semiconductor device of the first embodiment is a vertical metal oxide semiconductor field effect transistor (MOSFET) 100 of a planar gate type using silicon carbide. The MOSFET 100 of the first embodiment is, for example, a double implantation MOSFET (DIMOSFET) in which a body region and a source region are formed by ion implantation.

Hereinafter, a case where a first conductive type is an n-type and a second conductive type is a p-type will be described by way of example. The MOSFET 100 is a MOSFET of a vertical n-channel type using electrons as carriers.

Figure 2:
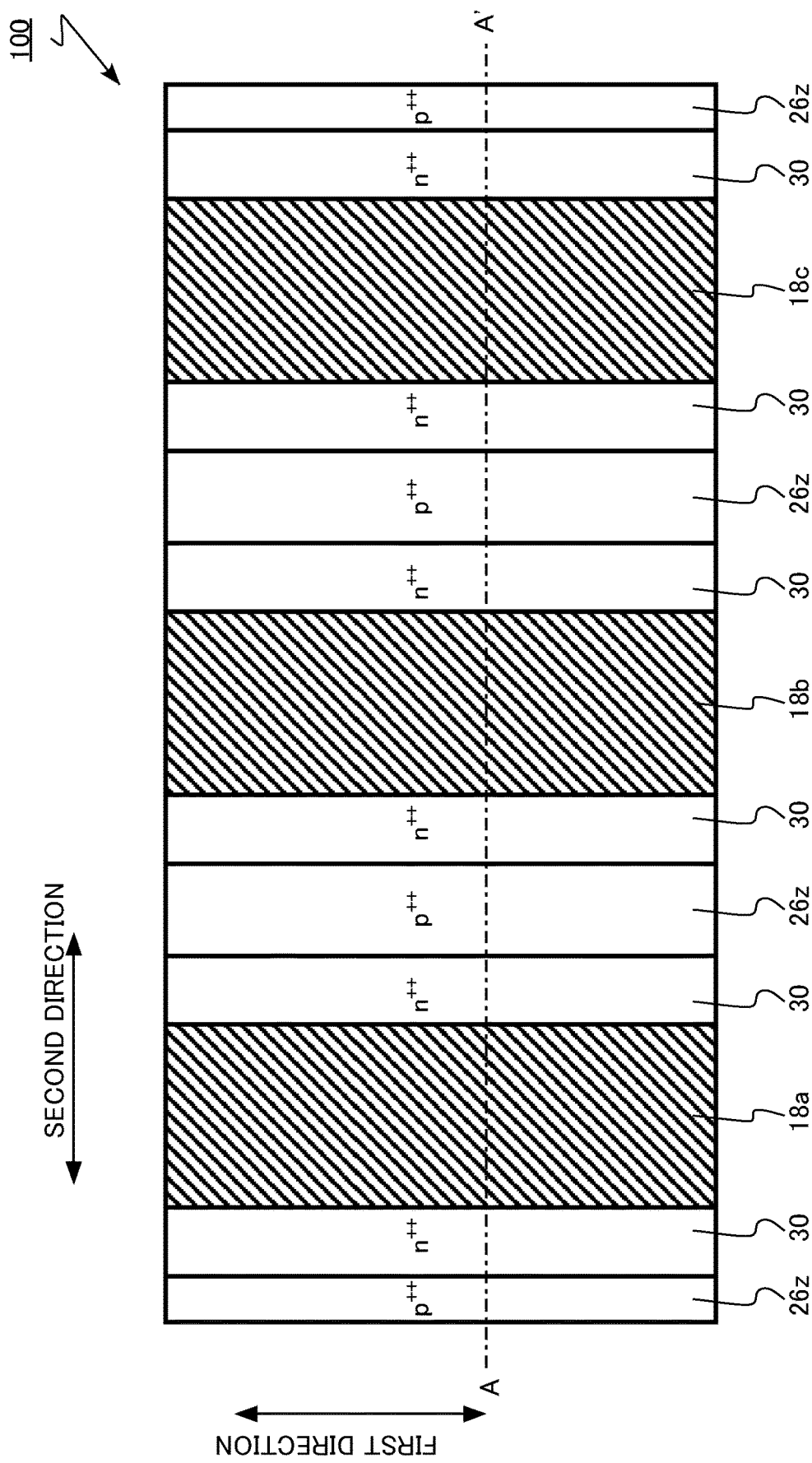
FIG. 2 is a schematic top view of the semiconductor device of the first embodiment.
Figure 3:
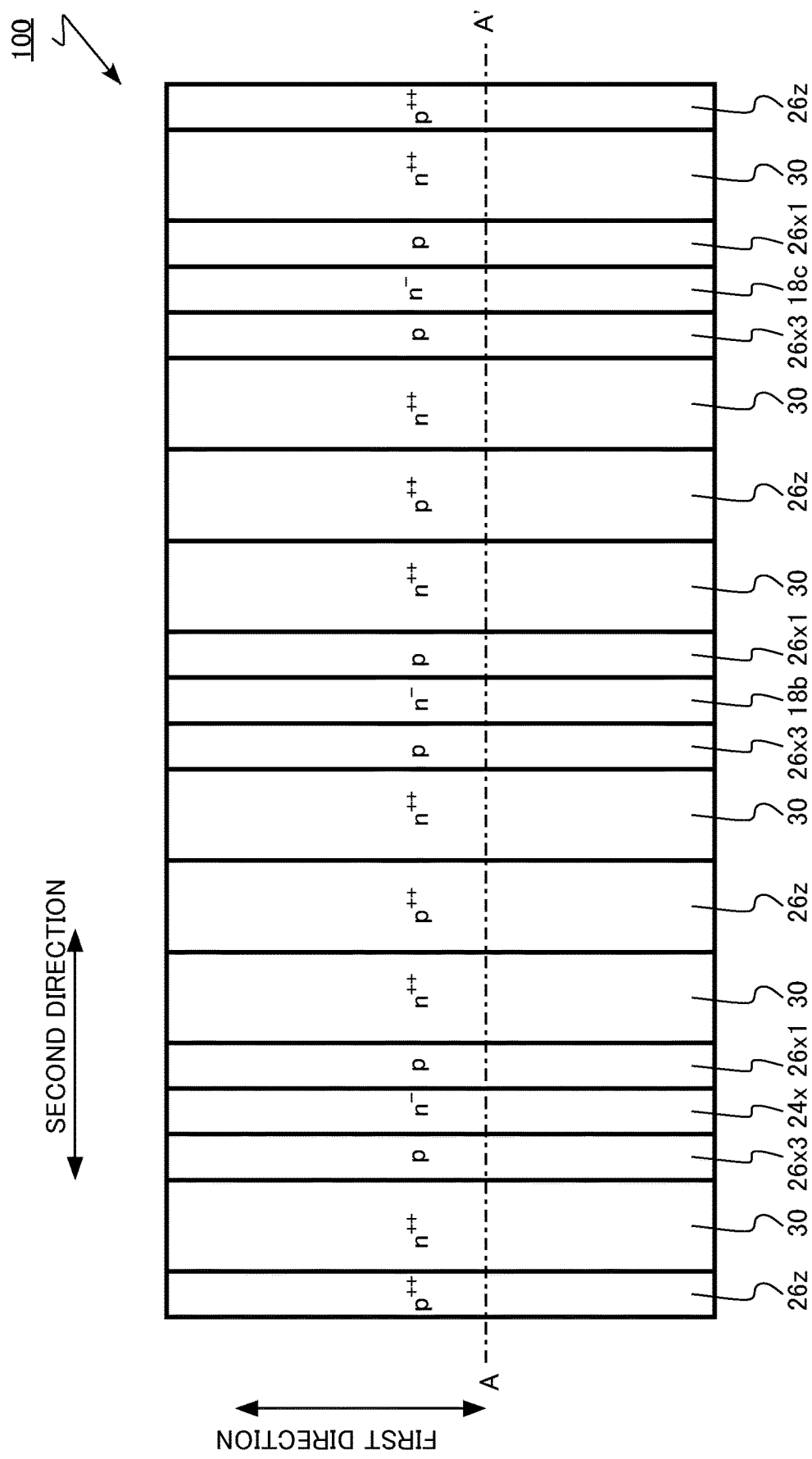
FIG. 3 is a schematic top view of the semiconductor device of the first embodiment.

FIG. 1 is a schematic cross-sectional view of the semiconductor device of the first embodiment. FIGS. 2 and 3 are schematic top views of the semiconductor device of the first embodiment. FIG. 2 is a schematic view illustrating patterns of gate electrodes and impurity regions formed on an upper face of the silicon carbide layer. FIG. 3 is a schematic view illustrating the patterns of the impurity regions formed on the upper face of the silicon carbide layer excluding the gate electrodes from FIG. 2. FIG. 1 is a cross-sectional view taken along line AA' of FIGS. 2 and 3.

The MOSFET 100 includes a silicon carbide layer 10, a source electrode 12 (first electrode), a drain electrode 14 (second electrode), a first gate insulating layer 16a, a second gate insulating layer 16b, a third gate insulating layer 16c, a first gate electrode 18a, a second gate electrode 18b, a third gate electrode 18c, and an interlayer insulating layer 20. The source electrode 12 has a contact electrode portion 12x (first portion).

In the silicon carbide layer 10, an $n^+$-type drain region 22, an n-type drift region 24 (first silicon carbide region), a p-type body region 26 (second silicon carbide region), and an $n^{++}$-type source region 30 (third silicon carbide region) are provided.

The n-type drift region 24 includes an $n^-$-type lower region 24x (first region), an n-type first low-concentration n region 24y1 (second region), an n-type second low-concentration n region 24y2 (sixth region), an n-type third low-concentration n region 24y3, an $n^+$-type first high-concentration n region 24z1 (third region), and an $n^+$-type second high-concentration n region 24z2 (seventh region).

The p-type body region 26 includes a p-type first low-concentration p region 26x1 (fourth region), a p-type second low-concentration p region 26x2 (eighth region), a p-type third low-concentration p region 26x3, a $p^+$-type first high-concentration p region 26y1 (fifth region), a $p^+$-type second high-concentration p region 26y2 (ninth region), and a $p^{++}$-type contact region 26z (tenth region).

The silicon carbide layer 10 is provided between the source electrode 12 and the drain electrode 14. The silicon carbide layer 10 is single crystal SiC. The silicon carbide layer 10 is, for example, 4H—SiC.

The silicon carbide layer 10 has a first face ("F1" in FIG. 1) and a second face ("F2" in FIG. 1). Hereinafter, the first face F1 may be referred to as a surface, and the second face F2 may be referred to as a back surface. The first face F1 is disposed on a side of the silicon carbide layer 10 close to the source electrode 12. In addition, the second face F2 is disposed on a side of the silicon carbide layer 10 close to the drain electrode 14. The first face F1 and the second face F2 face each other. Note that, hereinafter, a "depth" refers to a depth in a direction toward the second face based on the first face.

A first direction and a second direction are parallel to the first face F1. The second direction is perpendicular to the first direction. A direction from the first face F1 to the second face F2 is a third direction. The third direction is perpendicular to the first direction and the second direction.

The first face F1 is, for example, a face inclined at equal to or more than 0° and equal to or less than 8° with respect to a (0001) face. In addition, the second face F2 is, for example, a face inclined at equal to or more than 0° and equal to or less than 8° with respect to a (000-1) face. The (0001) face is referred to as a silicon face. The (000-1) face is referred to as a carbon face.

The n$^+$-type drain region 22 is provided on the back surface of the silicon carbide layer 10. The drain region 22 contains, for example, nitrogen (N) as n-type impurities. An n-type impurity concentration in the drain region 22 is, for example, equal to or more than $1\times10^{18}$ cm$^{-3}$ and equal to or less than $1\times10^{21}$ cm$^{-3}$.

The n-type drift region 24 is provided between the drain region 22 and the first face F1. The n-type drift region 24 is provided between the source electrode 12 and the drain electrode 14.

The n-type drift region 24 is provided on the drain region 22. The drift region 24 contains, for example, nitrogen (N) as n-type impurities. An n-type impurity concentration in the drift region 24 is lower than the n-type impurity concentration in the drain region 22. A thickness of the drift region 24 is, for example, equal to or more than 3 μm and equal to or less than 150 μm.

The drift region 24 includes an n$^-$-type lower region 24x (first region), an n-type first low-concentration n region 24y1 (second region), an n-type second low-concentration n region 24y2 (sixth region), an n-type third low-concentration n region 24y3, an n$^+$-type first high-concentration n region 24z1 (third region), and an n$^+$-type second high-concentration n region 24z2 (seventh region).

The n$^-$-type lower region 24x is provided on a side of the drift region 24 close to the second face F2. The lower region 24x is in contact with the drain region 22.

The lower region 24x contains, for example, nitrogen (N) as n-type impurities. An n-type impurity concentration in the lower region 24x is, for example, equal to or more than $4\times10^{14}$ cm$^{-3}$ and equal to or less than $1\times10^{17}$ cm$^{-3}$.

The n-type first low-concentration n region 24y1, the n-type second low-concentration n region 24y2, and the n-type third low-concentration n region 24y3 are disposed between the lower region 24x and the first face F1. The first low-concentration n region 24y1, the second low-concentration n region 24y2, and the third low-concentration n region 24y3 are disposed between the lower region 24x and the body region 26. The first low-concentration n region 24y1, the second low-concentration n region 24y2, and the third low-concentration n region 24y3 are in contact with the body region 26. The first low-concentration n region 24y1, the second low-concentration n region 24y2, and the third low-concentration n region 24y3 extend in the first direction.

The first low-concentration n region 24y1, the second low-concentration n region 24y2, and the third low-concentration n region 24y3 contain, for example, nitrogen (N) as n-type impurities. An n-type impurity concentration in each of the first low-concentration n region 24y1, the second low-concentration n region 24y2, and the third low-concentration n region 24y3 is equal to or higher than the n-type impurity concentration in the lower region 24x. The n-type impurity concentration in each of the first low-concentration n region 24y1, the second low-concentration n region 24y2, and the third low-concentration n region 24y3 is equal to or more than $4\times10^{14}$ cm$^{-3}$ and equal to or less than $2\times10^{17}$ cm$^{-3}$.

The n$^+$-type first high-concentration n region 24z1 and the n$^+$-type second high-concentration n region 24z2 are disposed between the lower region 24x and the first face F1. The first high-concentration n region 24z1 and the second high-concentration n region 24z2 are disposed between the lower region 24x and the body region 26. The first high-concentration n region 24z1 and the second high-concentration n region 24z2 are in contact with the body region 26. The first high-concentration n region 24z1 and the second high-concentration n region 24z2 extend in the first direction.

The first high-concentration n region 24z1 is disposed between the first low-concentration n region 24y1 and the second low-concentration n region 24y2. The second high-concentration n region 24z2 is disposed between the second low-concentration n region 24y2 and the third low-concentration n region 24y3.

The first high-concentration n region 24z1 and the second high-concentration n region 24z2 contain, for example, nitrogen (N) as n-type impurities. An n-type impurity concentration in each of the first high-concentration n region 24z1 and the second high-concentration n region 24z2 is higher than the n-type impurity concentration in each of the first low-concentration n region 24y1, the second low-concentration n region 24y2, and the third low-concentration n region 24y3.

The n-type impurity concentration in each of the first high-concentration n region 24z1 and the second high-concentration n region 24z2 is, for example, equal to or more than 1.5 times and equal to or less than 10 times the n-type impurity concentration in each of the first low-concentration n region 24y1, the second low-concentration n region 24y2, and the third low-concentration n region 24y3. The n-type impurity concentration in each of the first high-concentration n region 24z1 and the second high-concentration n region 24z2 is, for example, equal to or more than $1\times10^{15}$ cm$^{-3}$ and equal to or less than $2\times10^{17}$ cm$^{-3}$.

The p-type body region 26 is provided between the drift region 24 and the first face F1. The body region 26 extends in the first direction. The body region 26 functions as a channel region of the MOSFET 100.

A part of the body region 26 is in contact with the first face F1. The part of the body region 26 faces the first gate electrode 18a, the second gate electrode 18b, and the third gate electrode 18c. The part of the body region 26 serves as the channel region of the MOSFET 100.

The body region 26 contains, for example, aluminum (Al) as p-type impurities. A depth of the body region 26 is, for example, equal to or more than 500 nm and equal to or less than 900 nm. The body region 26 is electrically connected to the source electrode 12. The body region 26 is fixed to an electric potential of the source electrode 12.

The body region 26 includes a p-type first low-concentration p region 26x1 (fourth region), a p-type second low-concentration p region 26x2 (eighth region), a p-type third low-concentration p region 26x3, a p$^+$-type first high-concentration p region 26y1 (fifth region), a p$^+$-type second high-concentration p region 26y2 (ninth region), and a p$^{++}$-type contact region 26z (tenth region).

The first low-concentration p region 26x1 is in contact with the first low-concentration n region 24y1. The first low-concentration p region 26x1 is disposed in the third direction of the first low-concentration n region 24y1.

The second low-concentration p region 26x2 is in contact with the second low-concentration n region 24y2. The second low-concentration p region 26x2 is disposed in the third direction of the second low-concentration n region 24y2.

The third low-concentration p region 26x3 is in contact with the third low-concentration n region 24y3. The third low-concentration p region 26x3 is disposed in the third direction of the third low-concentration n region 24y3.

The first low-concentration p region 26x1, the second low-concentration p region 26x2, and the third low-concentration p region 26x3 contain, for example, aluminum (Al) as p-type impurities. A p-type impurity concentration in each of the first low-concentration p region 26x1, the second low-concentration p region 26x2, and the third low-concentration p region 26x3 is, for example, equal to or more than $5 \times 10^{16}$ $cm^{-3}$ and equal to or less than $5 \times 10^{19}$ $cm^{-3}$.

The first high-concentration p region 26y1 is in contact with the first high-concentration n region 24z1. The first high-concentration p region 26y1 is disposed in the third direction of the first high-concentration n region 24z1. The first high-concentration p region 26y1 is disposed between the first low-concentration p region 26x1 and the second low-concentration p region 26x2.

The first high-concentration p region 26y1 is disposed, for example, in the third direction of the contact electrode portion 12x. The first high-concentration p region 26y1 is disposed, for example, directly below the contact electrode portion 12x.

The first high-concentration p region 26y1 is disposed, for example, in the third direction of the contact region 26z. The first high-concentration p region 26y1 is disposed, for example, directly below the contact region 26z. The first high-concentration p region 26y1 is in contact with, for example, the contact region 26z.

The second high-concentration p region 26y2 is in contact with the second high-concentration n region 24z2. The second high-concentration p region 26y2 is disposed in the third direction of the second high-concentration n region 24z2. The second high-concentration p region 26y2 is disposed between the second low-concentration p region 26x2 and the third low-concentration p region 26x3.

The second high-concentration p region 26y2 is disposed, for example, in the third direction of the contact electrode portion 12x. The second high-concentration p region 26y2 is disposed, for example, directly below the contact electrode portion 12x.

The second high-concentration p region 26y2 is disposed, for example, in the third direction of the contact region 26z. The second high-concentration p region 26y2 is disposed, for example, directly below the contact region 26z. The second high-concentration p region 26y2 is in contact with, for example, the contact region 26z.

The first high-concentration p region 26y1 and the second high-concentration p region 26y2 contain, for example, aluminum (Al) as p-type impurities. A p-type impurity concentration in each of the first high-concentration p region 26y1 and the second high-concentration p region 26y2 is higher than the p-type impurity concentration in each of the first low-concentration p region 26x1, the second low-concentration p region 26x2, and the third low-concentration p region 26x3.

The p-type impurity concentration in each of the first high-concentration p region 26y1 and the second high-concentration p region 26y2 is, for example, equal to or more than 1.5 times and equal to or less than 10 times the p-type impurity concentration in each of the first low-concentration p region 26x1, the second low-concentration p region 26x2, and the third low-concentration p region 26x3. The p-type impurity concentration in each of the first high-concentration p region 26y1 and the second high-concentration p region 26y2 is, for example, equal to or more than $5 \times 10^{16}$ $cm^{-3}$ and equal to or less than $1 \times 10^{20}$ $cm^{-3}$.

The $p^{++}$-type contact region 26z is positioned between the first high-concentration p region 26y1 and the first face F1. The contact region 26z is positioned between the first high-concentration p region 26y1 and the source electrode 12. The contact region 26z is positioned between the first high-concentration p region 26y1 and the contact electrode portion 12x of the source electrode 12. The contact region 26z is disposed, for example, in the third direction of the first high-concentration p region 26y1. The contact region 26z is in contact with the first high-concentration p region 26y1.

The contact region 26z is positioned between the second high-concentration p region 26y2 and the first face F1. The contact region 26z is positioned between the second high-concentration p region 26y2 and the source electrode 12. The contact region 26z is positioned between the second high-concentration p region 26y2 and the contact electrode portion 12x of the source electrode 12. The contact region 26z is disposed, for example, in the third direction of the second high-concentration p region 26y2. The contact region 26z is in contact with the second high-concentration p region 26y2.

The contact region 26z is in contact with the source electrode 12. The contact region 26z is electrically connected to the source electrode 12. The contact between the contact region 26z and the source electrode 12 is, for example, an ohmic contact. The contact region 26z is fixed to the electric potential of the source electrode 12.

The contact region 26z is in contact with the contact electrode portion 12x of the source electrode 12. A depth of the contact region 26z is, for example, equal to or more than 200 nm and equal to or less than 500 nm.

The contact region 26z contains, for example, aluminum (Al) as p-type impurities. A p-type impurity concentration in the contact region 26z is higher than the p-type impurity concentration in each of the first high-concentration p region 26y1 and the second high-concentration p region 26y2. The p-type impurity concentration in the contact region 26z is, for example, equal to or more than $1 \times 10^{19}$ $cm^{-3}$ and equal to or less than $5 \times 10^{21}$ $cm^{-3}$.

The $n^+$-type source region 30 is provided between the body region 26 and the first face F1. The source region 30 is provided, for example, between the first low-concentration p region 26x1 and the first face F1. The source region 30 is provided, for example, between the first high-concentration p region 26y1 and the first face F1.

The source region 30 is provided, for example, between the third low-concentration p region 26x3 and the first face F1. The source region 30 is provided, for example, between the second high-concentration p region 26y2 and the first face F1.

The source region 30 contains, for example, phosphorus (P) or nitrogen (N) as n-type impurities. An n-type impurity concentration in the source region 30 is higher than the n-type impurity concentration in the drift region 24.

The n-type impurity concentration in the source region 30 is, for example, equal to or more than $1 \times 10^{19}$ $cm^{-3}$ and equal to or less than $5 \times 10^{21}$ $cm^{-3}$. A depth of the source region 30 is shallower than the depth of the body region 26. The depth of the source region 30 is, for example, equal to or more than 80 nm and equal to or less than 200 nm.

The source region 30 is in contact with the source electrode 12. The source region 30 is electrically connected to the source electrode 12. The contact between the source region 30 and the source electrode 12 is, for example, an ohmic contact. The source region 30 is fixed to the electric potential of the source electrode 12. The source region 30 is in contact with the contact electrode portion 12x of the source electrode 12.

The first gate electrode 18a is provided on a side of the first face F1 of the silicon carbide layer 10. The first gate electrode 18a extends in the first direction. The first gate electrode 18a faces the body region 26 provided on the first face F1.

The second gate electrode 18b is provided on the side of the first face F1 of the silicon carbide layer 10. The second gate electrode 18b extends in the first direction. The second gate electrode 18b is provided in the second direction with respect to the first gate electrode 18a. The second gate electrode 18b faces the body region 26 provided on the first face F1.

The third gate electrode 18c is provided on the side of the first face F1 of the silicon carbide layer 10. The third gate electrode 18c extends in the first direction. The third gate electrode 18c is provided in the second direction with respect to the second gate electrode 18b. The second gate electrode 18b is provided between the first gate electrode 18a and the third gate electrode 18c. The third gate electrode 18c faces the body region 26 provided on the first face F1.

The first gate electrode 18a, the second gate electrode 18b, and the third gate electrode 18c are conductive layers. The first gate electrode 18a, the second gate electrode 18b, and the third gate electrode 18c are, for example, polycrystalline silicon containing p-type impurities or n-type impurities.

The first gate insulating layer 16a is provided between the first gate electrode 18a and the body region 26. The second gate insulating layer 16b is provided between the second gate electrode 18b and the body region 26. The third gate insulating layer 16c is provided between the third gate electrode 18c and the body region 26.

The first gate insulating layer 16a, the second gate insulating layer 16b, and the third gate insulating layer 16c contain, for example, silicon oxide. Each of the first gate insulating layer 16a, the second gate insulating layer 16b, and the third gate insulating layer 16c includes, for example, a silicon oxide layer. For example, a high dielectric constant insulating material can be applied to each of the first gate insulating layer 16a, the second gate insulating layer 16b, and the third gate insulating layer 16c. In addition, for example, a stacked structure of a silicon oxide layer and a high dielectric constant insulating layer can be applied to each of the first gate insulating layer 16a, the second gate insulating layer 16b, and the third gate insulating layer 16c.

A thickness of each of the first gate insulating layer 16a, the second gate insulating layer 16b, and the third gate insulating layer 16c is, for example, equal to or more than 30 nm and equal to or less than 100 nm.

The interlayer insulating layer 20 is provided on the first gate electrode 18a, the second gate electrode 18b, and the third gate electrode 18c. The interlayer insulating layer 20 is provided between the first gate electrode 18a and the source electrode 12, between the second gate electrode 18b and the source electrode 12, and between the third gate electrode 18c and the source electrode 12.

The interlayer insulating layer 20 electrically isolates the first gate electrode 18a from the source electrode 12, the second gate electrode 18b from the source electrode 12, and the third gate electrode 18c from the source electrode 12. The interlayer insulating layer 20 contains, for example, silicon oxide. The interlayer insulating layer 20 is, for example, a silicon oxide layer.

The source electrode 12 is provided on the side of the first face F1 of the silicon carbide layer 10. The source electrode 12 is in contact with the silicon carbide layer 10. The source electrode 12 is in contact with the contact region 26z and the source region 30.

The source electrode 12 has the contact electrode portion 12x. The contact electrode portion 12x is provided between the first gate electrode 18a and the second gate electrode 18b. The contact electrode portion 12x is in contact with the contact region 26z and the source region 30.

The source electrode 12 contains a metal. The source electrode 12 has, for example, a stacked structure of a barrier metal film and a metal film.

The barrier metal film contains, for example, titanium (Ti), tungsten (W), or tantalum (Ta). The barrier metal film is, for example, a titanium film, a titanium nitride film, a tungsten nitride film, or a tantalum nitride film.

The metal film contains, for example, aluminum (Al). The metal film is, for example, an aluminum film.

The contact electrode portion 12x of the source electrode 12 includes, for example, a metal silicide layer. The metal silicide layer is in contact with, for example, the contact region 26z. The metal silicide layer is in contact with, for example, the source region 30.

The metal silicide layer contains, for example, nickel (Ni), titanium (Ti), or cobalt (Co). The metal silicide layer is, for example, a nickel silicide layer, a titanium silicide layer, or a cobalt silicide layer.

The drain electrode 14 is provided on a side of the second face F2 of the silicon carbide layer 10. The drain electrode 14 is provided on the second face F2 of the silicon carbide layer 10. The drain electrode 14 is in contact with the second face F2.

The drain electrode 14 contains, for example, a metal or a metal semiconductor compound. The drain electrode 14 includes, for example, a nickel silicide layer, a titanium layer, a nickel layer, a silver layer, or a gold layer.

The drain electrode 14 is electrically connected to the drain region 22. The drain electrode 14 is in contact with, for example, the drain region 22.

Next, a function and effect of the MOSFET 100 of the first embodiment will be described.

Figure 4:
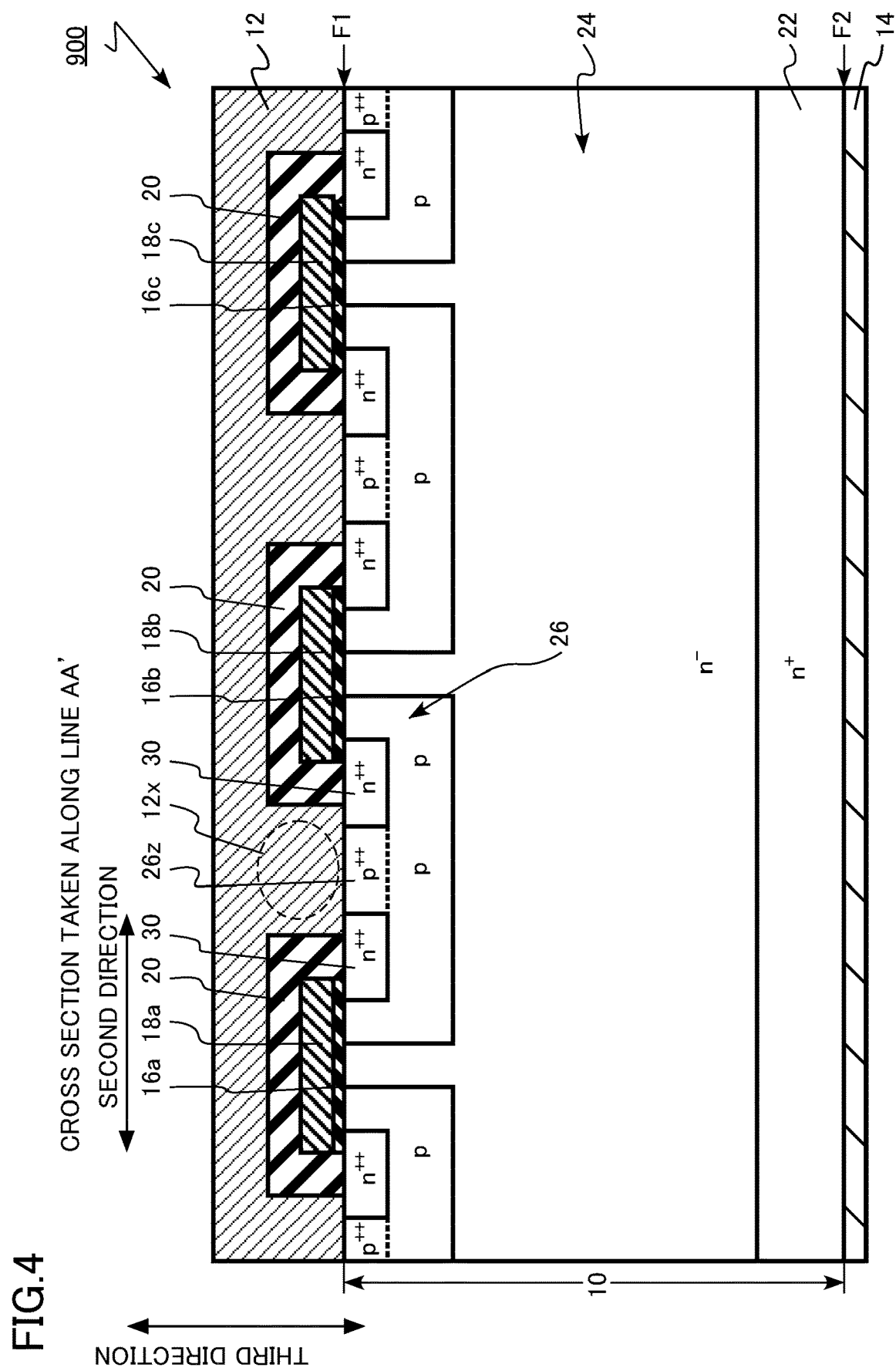
FIG. 4 is a schematic cross-sectional view of a semiconductor device of a comparative example.

FIG. 4 is a schematic cross-sectional view of a semiconductor device of a comparative example. FIG. 4 is a view corresponding to FIG. 1 of the first embodiment.

The semiconductor device of the comparative example is a MOSFET 900 of a planar gate type using silicon carbide.

The MOSFET 900 is different from the MOSFET 100 of the first embodiment in that an n-type drift region 24 does not include an $n^+$-type first high-concentration n region 24z1 and an $n^+$-type second high-concentration n region 24z2. In addition, the MOSFET 900 is different from the MOSFET 100 of the first embodiment in that a p-type body region 26 does not include a $p^+$-type first high-concentration p region 26y1 and a $p^+$-type second high-concentration p region 26y2.

When a reverse bias voltage exceeding a breakdown voltage is applied to the MOSFET, avalanche breakdown occurs at a pn junction, and an avalanche current flows. When the avalanche current flows, for example, a temperature of the MOSFET is increased, such that the MOSFET may be broken. When the avalanche breakdown occurs, a current or energy allowed by the MOSFET is referred to as avalanche resistance.

In the MOSFET 900, for example, a breakdown voltage of the pn junction between the p-type body region 26 and the n-type drift region 24 provided in a cell portion is too high, such that the reverse bias voltage at which avalanche breakdown occurs is increased, and the avalanche resistance may be decreased. In particular, when the avalanche breakdown occurs before the cell portion at the pn junction in a termination region (not illustrated) surrounding the cell portion of the MOSFET 900, the avalanche resistance is decreased. This is because an area of the termination region is smaller than an area of the cell portion. Therefore, a current to flow through the MOSFET 900 is limited.

In the MOSFET 100 of the first embodiment, the n-type drift region 24 includes the $n^+$-type first high-concentration n region 24z1 and the $n^+$-type second high-concentration n region 24z2. In addition, the p-type body region 26 includes the $p^+$-type first high-concentration p region 26y1 and the $p^+$-type second high-concentration p region 26y2.

The MOSFET 100 includes a pn junction formed in the $n^+$-type first high-concentration n region 24z1 and the $p^+$-type first high-concentration p region 26y1, and a pn junction formed in the $n^+$-type second high-concentration n region 24z2 and the $p^+$-type second high-concentration p region 26y2. Since the MOSFET 100 partially includes a pn junction having a high impurity concentration in the cell portion, avalanche breakdown easily occurs in the cell portion. Therefore, the avalanche resistance of the MOSFET 100 is improved.

From the viewpoint of improving the avalanche resistance, it is preferable to provide two pn junctions of the pn junction formed in the first high-concentration n region 24z1 and the first high-concentration p region 26y1 and the pn junction formed in the second high-concentration n region 24z2 and the second high-concentration p region 26y2 for one contact electrode portion 12x. By providing the two pn junctions, paths for the avalanche current flowing in one contact electrode portion 12x are dispersed, and heat generation in the contact electrode portion 12x is suppressed. Therefore, the avalanche resistance is improved.

From the viewpoint of improving the avalanche resistance, the first high-concentration p region 26y1 is preferably disposed in the third direction of the contact region 26z. In other words, the first high-concentration p region 26y1 is preferably disposed directly below the contact region 26z. In addition, the first high-concentration p region 26y1 is preferably in contact with the contact region 26z. With the above configuration, electrical resistance of the path through which the avalanche current flows is reduced. Therefore, the heat generation of the contact electrode portion 12x is suppressed, and the avalanche resistance is improved.

Similarly, from the viewpoint of improving the avalanche resistance, the second high-concentration p region 26y2 is preferably disposed in the third direction of the contact region 26z. In other words, the second high-concentration p region 26y2 is preferably disposed directly below the contact region 26z. In addition, the second high-concentration p region 26y2 is preferably in contact with the contact region 26z. With the above configuration, electrical resistance of the path through which the avalanche current flows is reduced. Therefore, the heat generation of the contact electrode portion 12x is suppressed, and the avalanche resistance is improved.

From the viewpoint of improving the avalanche resistance, the p-type impurity concentration in each of the first high-concentration p region 26y1 and the second high-concentration p region 26y2 is preferably equal to or more than 1.5 times and more preferably equal to or more than 2 times the p-type impurity concentration in each of the first low-concentration p region 26x1, the second low-concentration p region 26x2, and the third low-concentration p region 26x3.

MODIFICATION

Figure 5:
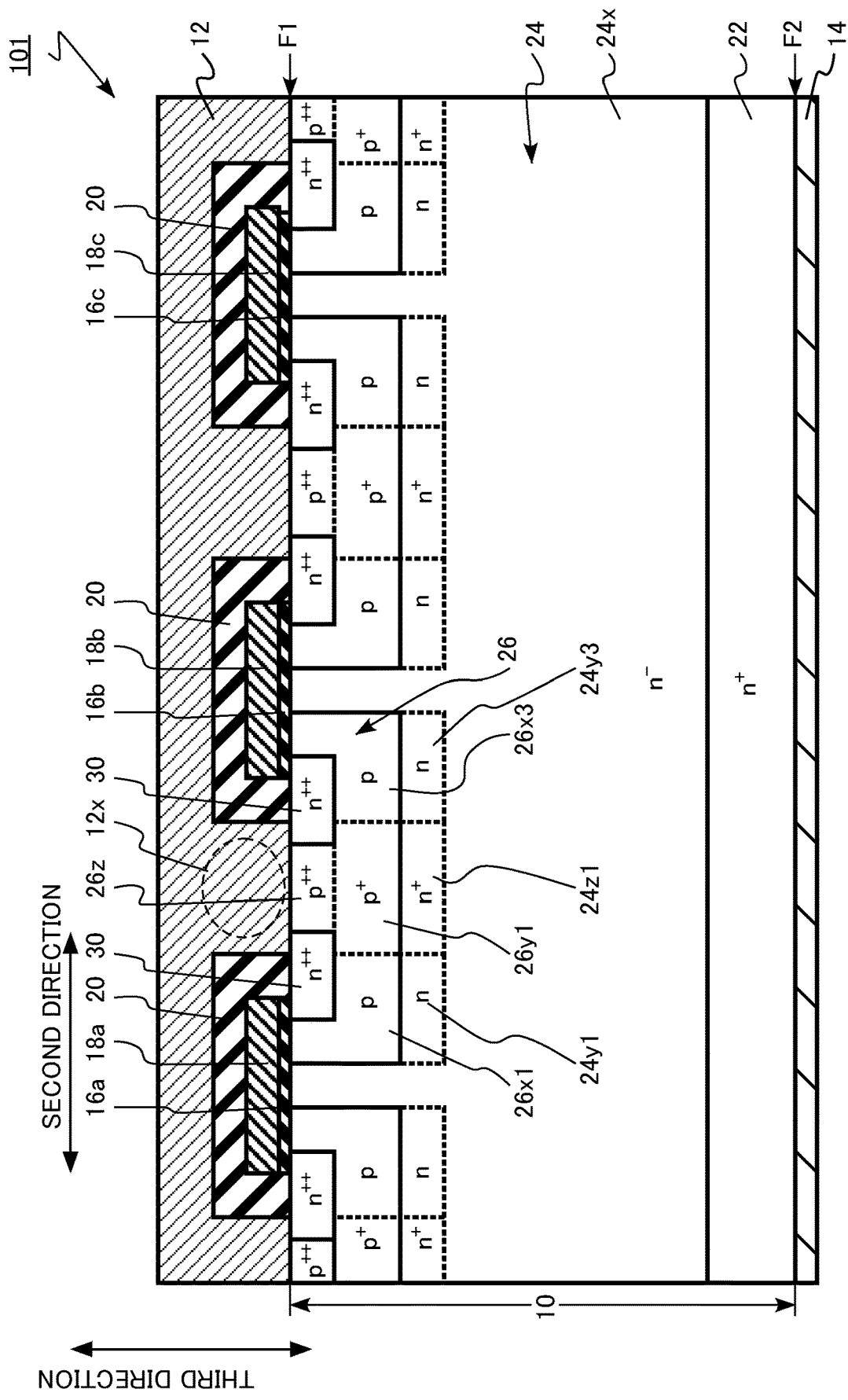
FIG. 5 is a schematic cross-sectional view of a semiconductor device of a modification of the first embodiment.

FIG. 5 is a schematic cross-sectional view of a semiconductor device of a modification of the first embodiment. FIG. 5 is a view corresponding to FIG. 1 of the first embodiment.

The semiconductor device of the modification is a MOSFET 101 of a planar gate type using silicon carbide.

The MOSFET 101 is different from the MOSFET 100 of the first embodiment in that an n-type drift region 24 does not include an n-type second low-concentration n region 24y2 and an $n^+$-type second high-concentration n region 24z2. In addition, the MOSFET 101 is different from the MOSFET 100 of the first embodiment in that a p-type body region 26 does not include a p-type second low-concentration p region 26x2 and a $p^+$-type second high-concentration p region 26y2.

Avalanche resistance of the MOSFET 101 is improved by the same function as that of the MOSFET 100 of the first embodiment.

As described above, according to the first embodiment and the modification, it is possible to realize a MOSFET having improved avalanche resistance.

Second Embodiment

A semiconductor device of a second embodiment is different from the semiconductor device of the first embodiment in that a first silicon carbide region further includes an eleventh region in contact with a first face, a first electrode further has a second portion in contact with the eleventh region, the second portion is provided between a first gate electrode and a second gate electrode, and the second portion is disposed in a first direction of a first portion. Hereinafter, some descriptions of contents overlapping with the first embodiment may be omitted.

The semiconductor device of the second embodiment is a vertical MOSFET 200 of a planar gate type using silicon carbide. The MOSFET 200 of the second embodiment is a DIMOSFET. In addition, the MOSFET 200 of the second embodiment includes a Schottky barrier diode (SBD) as a built-in diode.

Hereinafter, a case where a first conductive type is an n-type and a second conductive type is a p-type will be described by way of example. The MOSFET 200 is a MOSFET of a vertical n-channel type using electrons as carriers.

Figure 6:
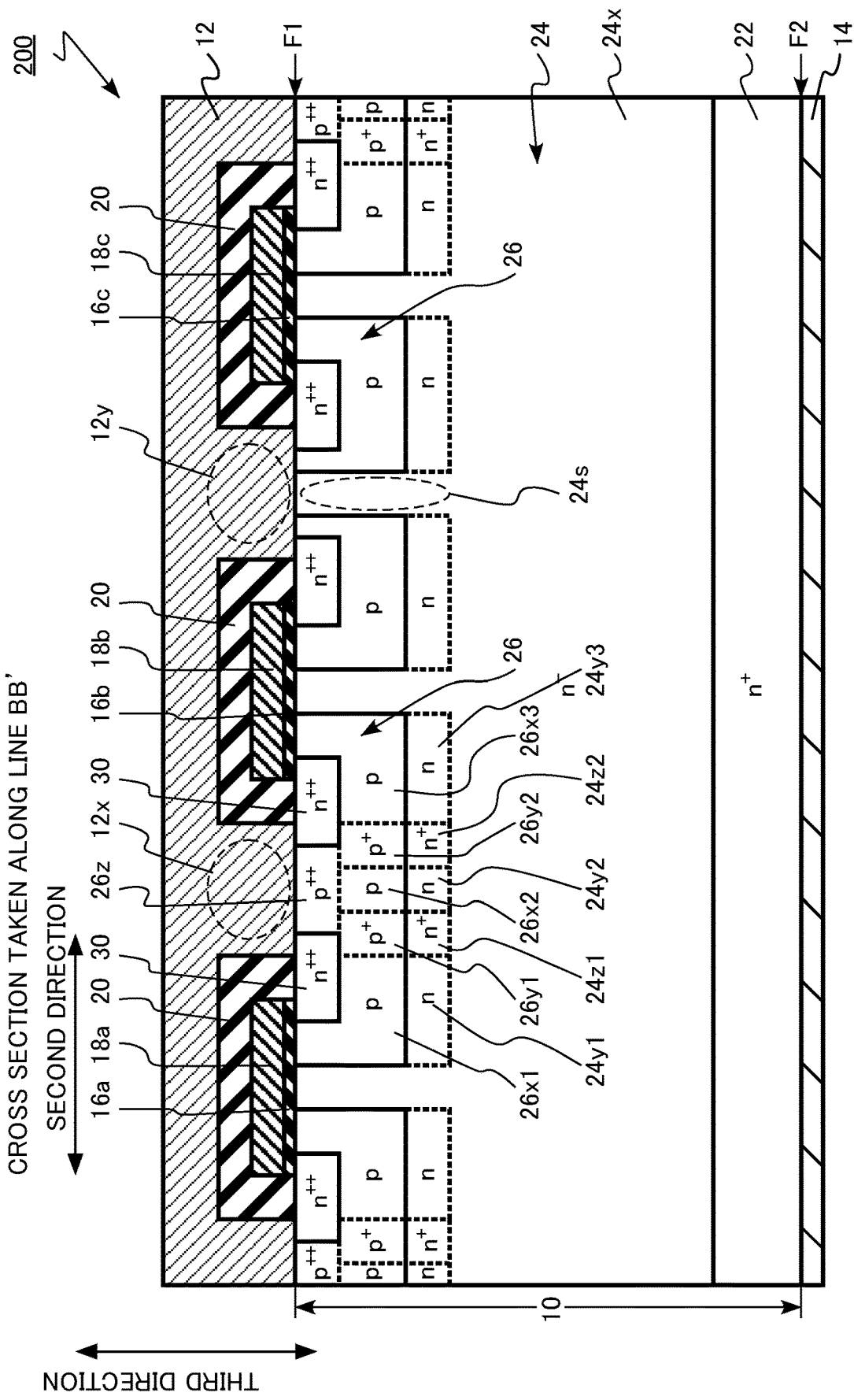
FIG. 6 is a schematic cross-sectional view of a semiconductor device of a second embodiment.
Figure 7:
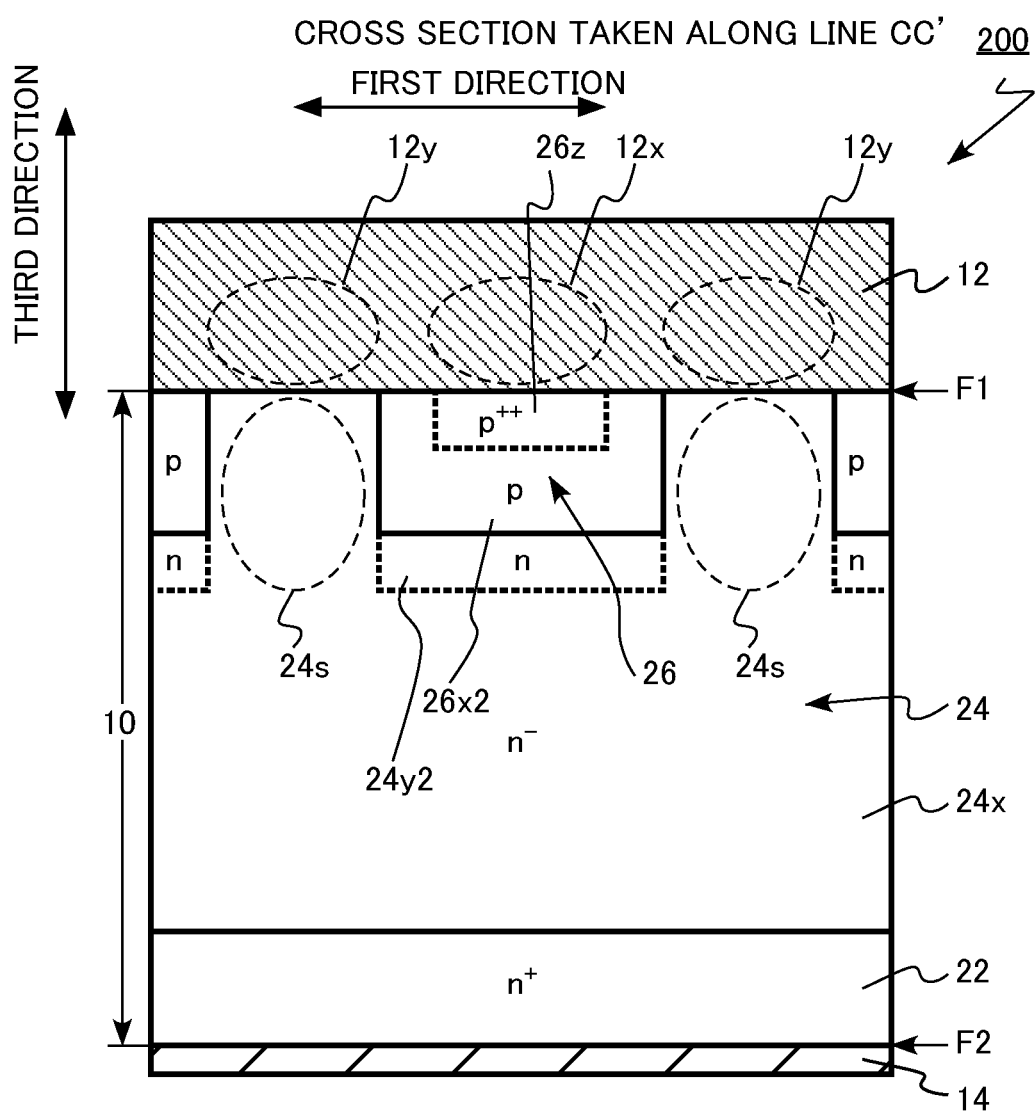
FIG. 7 is a schematic cross-sectional view of the semiconductor device of the second embodiment.
Figure 8:
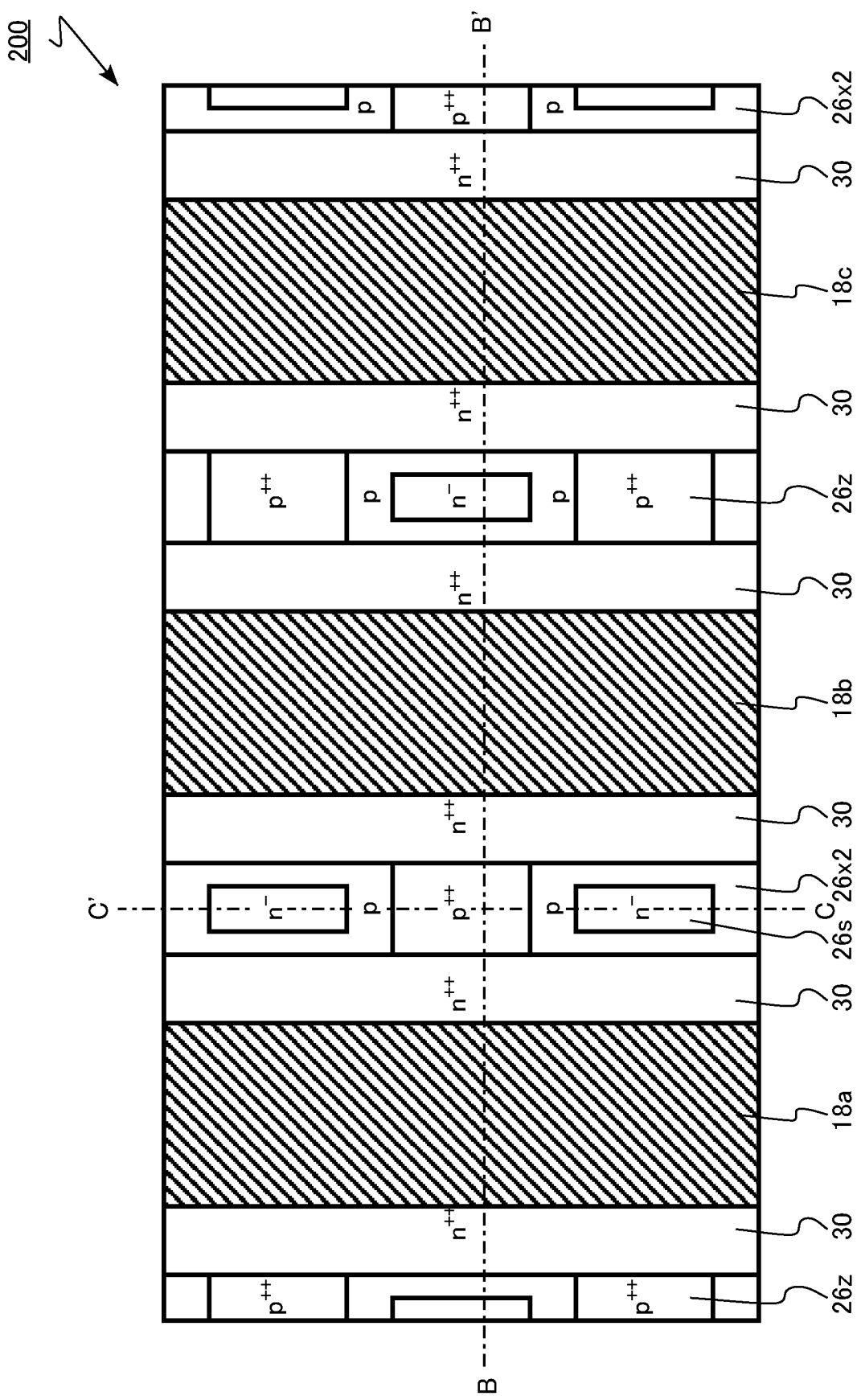
FIG. 8 is a schematic top view of the semiconductor device of the second embodiment.
Figure 9:
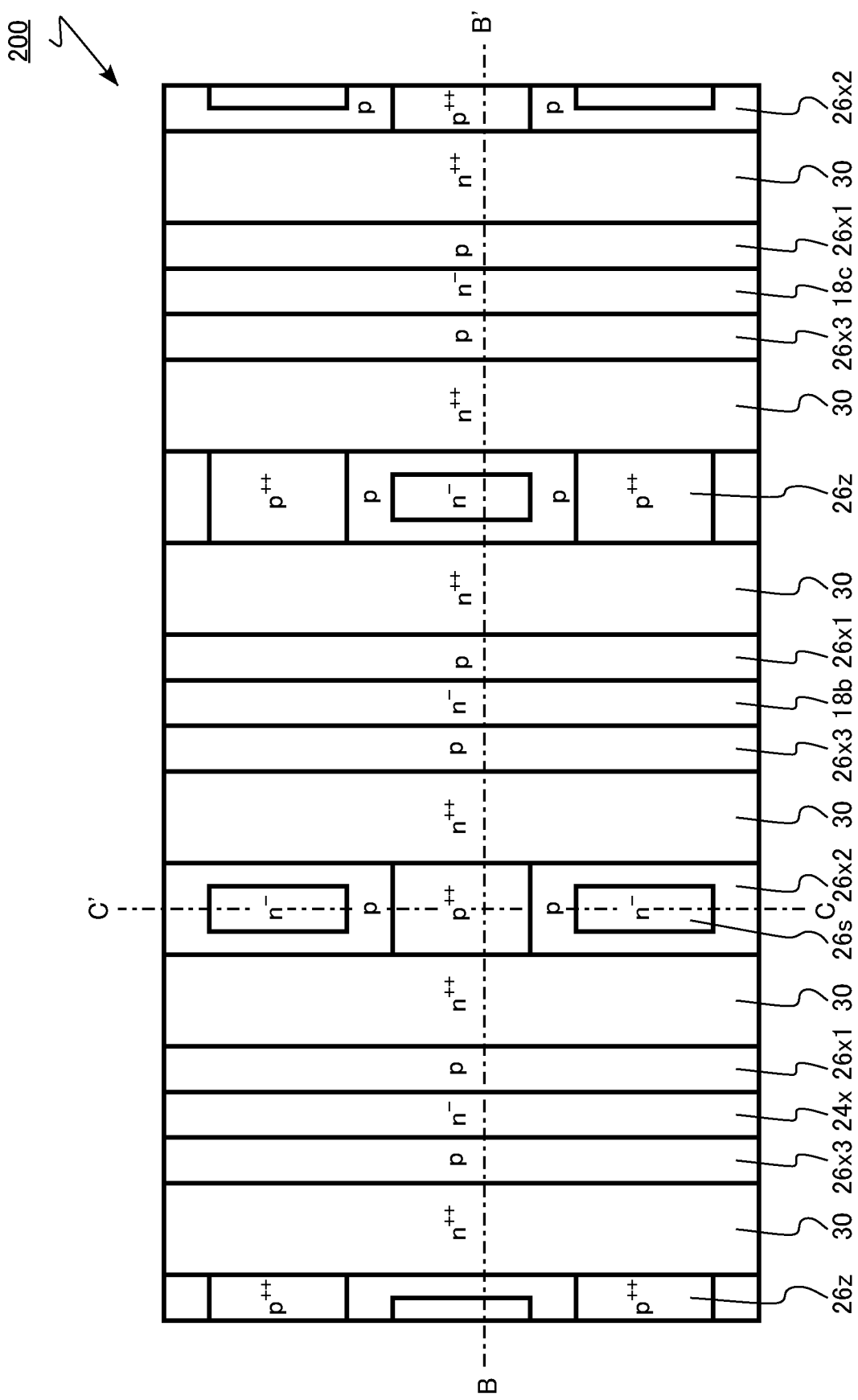
FIG. 9 is a schematic top view of the semiconductor device of the second embodiment.

FIGS. 6 and 7 are schematic cross-sectional views of the semiconductor device of the second embodiment. FIGS. 8 and 9 are schematic top views of the semiconductor device of the second embodiment. FIG. 8 is a schematic view illustrating patterns of gate electrodes and impurity regions formed on an upper face of a silicon carbide layer. FIG. 9 is a schematic view illustrating the patterns of the impurity regions formed on the upper face of the silicon carbide layer excluding the gate electrodes from FIG. 8. FIG. 6 is a cross-sectional view taken along line BB' of FIGS. 8 and 9. FIG. 7 is a cross-sectional view taken along line BB' of FIGS. 8 and 9.

The MOSFET 200 includes a silicon carbide layer 10, a source electrode 12 (first electrode), a drain electrode 14 (second electrode), a first gate insulating layer 16a, a second gate insulating layer 16b, a third gate insulating layer 16c, a first gate electrode 18a, a second gate electrode 18b, a third gate electrode 18c, and an interlayer insulating layer 20. The source electrode 12 has a contact electrode portion 12x (first portion) and a diode electrode portion 12y (second portion).

In the silicon carbide layer 10, an n⁺-type drain region 22, an n-type drift region 24 (first silicon carbide region), a p-type body region 26 (second silicon carbide region), and an n⁺⁺-type source region 30 (third silicon carbide region) are provided.

The n-type drift region 24 includes an n⁻-type lower region 24x (first region), an n-type first low-concentration n region 24y1 (second region), an n-type second low-concentration n region 24y2 (sixth region), an n-type third low-concentration n region 24y3, an n⁺-type first high-concentration n region 24z1 (third region), an n⁺-type second high-concentration n region 24z2 (seventh region), and a JBS region 24s (eleventh region).

The p-type body region 26 includes a p-type first low-concentration p region 26x1 (fourth region), a p-type second low-concentration p region 26x2 (eighth region), a p-type third low-concentration p region 26x3, a p⁺-type first high-concentration p region 26y1 (fifth region), a p⁺-type second high-concentration p region 26y2 (ninth region), and a p⁺⁺-type contact region 26z (tenth region).

The source electrode 12 has the contact electrode portion 12x and the diode electrode portion 12y. The contact electrode portion 12x and the diode electrode portion 12y are provided between the first gate electrode 18a and the second gate electrode 18b. The contact electrode portion 12x and the diode electrode portion 12y are provided between the second gate electrode 18b and the third gate electrode 18c.

The diode electrode portion 12y is disposed in the first direction of the contact electrode portion 12x.

The n-type drift region 24 includes the JBS region 24s. The JBS region 24s is in contact with the first face F1. The JBS region 24s is surrounded by the body region 26.

The JBS region 24s is in contact with the diode electrode portion 12y of the source electrode 12. The JBS region 24s functions as a cathode region of the SBD.

In the drift region 24 surrounding the JBS region 24s, the n⁺-type first high-concentration n region 24z1 and the n⁺-type second high-concentration n region 24z2 do not exist. In addition, in the body region 26 surrounding the JBS region 24s, the p⁺-type first high-concentration p region 26y1 and the p⁺-type second high-concentration p region 26y2 do not exist.

Next, a function and effect of the MOSFET 200 of the second embodiment will be described.

Figure 10:
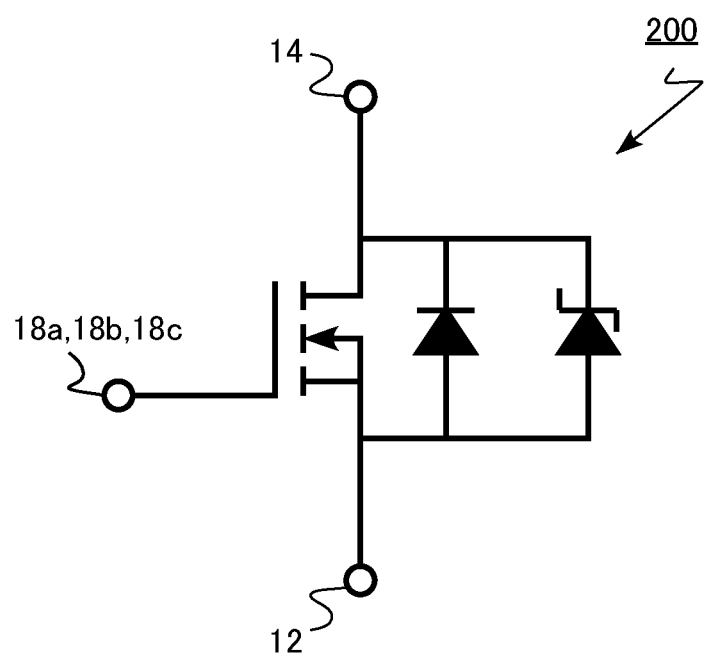
FIG. 10 is an equivalent circuit diagram of the semiconductor device of the second embodiment.

FIG. 10 is an equivalent circuit diagram of the semiconductor device of the second embodiment. In the MOSFET 200, a pn diode and the SBD are connected as built-in diodes in parallel with the transistor between the source electrode 12 and the drain electrode 14. The body region 26 is an anode region of a pn junction diode, and the drift region 24 is a cathode region of the pn junction diode. In addition, the source electrode 12 is an anode electrode of the SBD, and the JBS region 24s is a cathode region of the SBD.

For example, a case where the MOSFET 200 is used as a switching device connected to an inductive load is considered. When the MOSFET 200 is turned off, a voltage that is positive with respect to the drain electrode 14 may be applied to the source electrode 12 due to an induced current caused by the inductive load. In this case, a forward current flows through the built-in diode. This state is also referred to as a reverse conduction state.

On the contrary, when the MOSFET does not include the SBD, a forward current flows through the pn junction diode. The pn junction diode performs a bipolar operation. When a reflux current flows using the pn junction diode that performs a bipolar operation, a stacking defect occurs in the silicon carbide layer due to recombination energy of the carriers. When the stacking defect occurs in the silicon carbide layer, a problem that on-resistance of the MOSFET is increased occurs. An increase in on-resistance of the MOSFET causes a decrease in reliability of the MOSFET.

The MOSFET 200 includes the SBD. A forward voltage (Vf) at which the forward current starts to flow through the SBD is lower than a forward voltage (Vf) of the pn junction diode. Therefore, the forward current flows through the SBD prior to the pn junction diode.

The forward voltage (Vf) of the SBD is, for example, equal to or more than 1.0 V and less than 2.0 V. The forward voltage (Vf) of the pn junction diode is, for example, equal to or more than 2.0 V and equal to or less than 3.0 V.

The SBD performs a unipolar operation. Therefore, even when the forward current flows, the stacking defect does not occur in the silicon carbide layer 10 due to the recombination energy of the carriers. Therefore, the increase in on-resistance of the MOSFET 200 is suppressed. As a result, the reliability of the MOSFET 200 is increased.

In addition, similar to the MOSFET 100 of the first embodiment, the MOSFET 200 includes a pn junction formed in the n⁺-type first high-concentration n region 24z1 and the p⁺-type first high-concentration p region 26y1, and a pn junction formed in the n⁺-type second high-concentration n region 24z2 and the p⁺-type second high-concentration p region 26y2. Therefore, avalanche resistance of the MOSFET 200 is improved by the same function as that of the MOSFET 100.

In addition, in the drift region 24 surrounding the JBS region 24s of the MOSFET 200, the n⁺-type first high-concentration n region 24z1 and the n⁺-type second high-concentration n region 24z2 do not exist. In addition, in the body region 26 surrounding the JBS region 24s, the p⁺-type first high-concentration p region 26y1 and the p⁺-type second high-concentration p region 26y2 do not exist.

Therefore, avalanche breakdown occurs in the vicinity of the JBS region 24s, and an avalanche current is suppressed from flowing. Therefore, characteristic degradation of a Schottky junction of the SBD due to heat generation can be suppressed.

In the first and second embodiments, the case of 4H—SiC is described as an example of the crystal structure of SiC, but the present disclosure can also be applied to devices using SiC having other crystal structures such as 6H—SiC and 3C—SiC. In addition, it is also possible to apply a face other than the (0001) face to the surface of the silicon carbide layer 10.

In the first and second embodiments, the case where the first conductive type is an n-type and the second conductive type is a p-type is described as an example, but the first conductive type can be a p-type, and the second conductive type can be an n-type.

In the first and second embodiments, aluminum (Al) is exemplified as the p-type impurities, but boron (B) can also be used. In addition, nitrogen (N) and phosphorous (P) are exemplified as the n-type impurities, but arsenic (As), antimony (Sb), and the like can also be applied.

In addition, the present disclosure can also be applied to an insulated gate bipolar transistor (IGBT).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first face and a second face facing the first face;
   a first silicon carbide region of a first conductive type provided in the silicon carbide layer, the first silicon carbide region including a first region, a second region, and a third region, the second region is disposed between the first region and the first face, the third region is disposed between the first region and the first face, a first-conductivity type impurity concentration in the second region is equal to or higher than a first-conductivity type impurity concentration in the first region, and a first-conductivity type impurity concentration in the third region is higher than the first-conductivity type impurity concentration in the second region;
   a second silicon carbide region of a second conductive type provided in the silicon carbide layer and disposed between the first silicon carbide region and the first face, the second silicon carbide region including a fourth region and a fifth region, the fourth region is in contact with the second region, the fifth region is in contact with the third region, and a second-conductivity type impurity concentration in the fifth region is higher than a second-conductivity type impurity concentration in the fourth region;
   a third silicon carbide region of a first conductive type provided in the silicon carbide layer and disposed between the second silicon carbide region and the first face;
   a first gate electrode provided on a side of the first face of the silicon carbide layer, the first gate electrode extending in a first direction parallel to the first face, and the first gate electrode facing the second silicon carbide region on the first face;
   a second gate electrode provided on the side of the first face of the silicon carbide layer, the second gate electrode extending in the first direction, the second gate electrode provided in a second direction with respect to the first gate electrode, the second direction being parallel to the first face and perpendicular to the first direction, and the second gate electrode facing the second silicon carbide region on the first face;
   a first gate insulating layer provided between the second silicon carbide region and the first gate electrode;
   a second gate insulating layer provided between the second silicon carbide region and the second gate electrode;
   a first electrode provided on the side of the first face of the silicon carbide layer, the first electrode having a first portion provided between the first gate electrode and the second gate electrode and in contact with the second silicon carbide region and the third silicon carbide region; and
   a second electrode provided on the side of the second face of the silicon carbide layer,
   wherein the third region is in contact with the second region, and the fifth region is in contact with the fourth region.

2. The semiconductor device according to claim 1, wherein the first silicon carbide region further includes a sixth region and a seventh region, the sixth region is disposed between the first region and the first face, the seventh region is disposed between the first region and the first face, a first-conductivity type impurity concentration in the sixth region is equal to or higher than the first-conductivity type impurity concentration in the first region, a first-conductivity type impurity concentration in the seventh region is higher than that in the second region, and the sixth region is disposed between the third region and the seventh region, and
   the second silicon carbide region further includes an eighth region and a ninth region, the eighth region is in contact with the sixth region, the ninth region is in contact with the seventh region, a second-conductivity type impurity concentration in the ninth region is higher than a second-conductivity type impurity concentration in the eighth region, and the eighth region is disposed between the fifth region and the ninth region.

3. The semiconductor device according to claim 2, wherein the fifth region is positioned in a third direction from the first face to the second face with respect to the first portion, and
   the ninth region is positioned in the third direction with respect to the first portion.

4. The semiconductor device according to claim 1, wherein the first-conductivity type impurity concentration in the second region is higher than the first-conductivity type impurity concentration in the first region.

5. The semiconductor device according to claim 1, wherein the second-conductivity type impurity concentration in the fifth region is equal to or more than 1.5 times and equal to or less than 10 times the second-conductivity type impurity concentration in the fourth region.

6. The semiconductor device according to claim 1, wherein the fifth region is positioned in a third direction from the first face to the second face with respect to the first portion.

7. The semiconductor device according to claim 1, wherein the second silicon carbide region further includes a tenth region, the tenth region is positioned between the fifth region and the first portion, and a second-conductivity type impurity concentration in the tenth region is higher than the second-conductivity type impurity concentration in the fifth region.

8. The semiconductor device according to claim 1, wherein the first silicon carbide region further includes an eleventh region in contact with the first face, and
   the first electrode further has a second portion in contact with the eleventh region.

9. The semiconductor device according to claim 8, wherein the second portion is provided between the first gate electrode and the second gate electrode, and the second portion is positioned in the first direction with respect to the first portion.

10. The semiconductor device according to claim 1, wherein the first silicon carbide region is in contact with the first gate insulating layer and the second gate insulating layer.

* * * * *